United States Patent
Uetake (10) Patent No.: US 8,158,189 B2
(45) Date of Patent: Apr. 17, 2012

(54) METHOD FOR PRODUCING DISPLAY DEVICE

(75) Inventor: Naoki Uetake, Kanagawa (JP)

(73) Assignee: Sony Corporation, Tokyo (JP)

( * ) Notice: Subject to any disclaimer, the term of this patent is extended or adjusted under 35 U.S.C. 154(b) by 585 days.

(21) Appl. No.: 12/353,520

(22) Filed: Jan. 14, 2009

(65) Prior Publication Data

US 2009/0181163 A1 Jul. 16, 2009

(30) Foreign Application Priority Data

Jan. 15, 2008 (JP) ................................. 2008-005419

(51) Int. Cl.
*B05D 5/06* (2006.01)

(52) U.S. Cl. ................. 427/66; 427/64; 427/65; 427/67; 427/68; 427/69; 427/77; 427/78; 427/287

(58) Field of Classification Search .................... None
See application file for complete search history.

(56) References Cited

U.S. PATENT DOCUMENTS

| | | | |
|---|---|---|---|
| 4,615,781 A | * | 10/1986 | Boudreau .................. 427/96.8 |
| 4,915,057 A | * | 4/1990 | Boudreau et al. .............. 118/505 |
| 6,827,622 B2 | * | 12/2004 | Yamada et al. ................. 445/24 |
| 7,153,180 B2 | * | 12/2006 | Cok et al. ........................ 445/58 |
| 7,560,133 B2 | * | 7/2009 | Kawase ........................... 427/77 |
| 7,922,554 B2 | * | 4/2011 | Yamazaki et al. .............. 445/24 |
| 7,948,171 B2 | * | 5/2011 | Sakakura et al. ............. 313/506 |
| 2005/0253524 A1 | * | 11/2005 | Ishida ........................... 313/634 |

FOREIGN PATENT DOCUMENTS

| | | |
|---|---|---|
| JP | 2003-017256 | 1/2003 |
| JP | 2003-017258 | 1/2003 |

OTHER PUBLICATIONS

Japanese Patent Office Action corresponding to Japanese Serial No. 2008-005419 dated Nov. 10, 2009.

* cited by examiner

*Primary Examiner* — Jeffrey Wollschlager
(74) *Attorney, Agent, or Firm* — SNR Denton US LLP (57) ABSTRACT

Disclosed herein is a method for producing display devices for forming deposited patterns conforming to pixels on a substrate by means of elongated evaporation sources and a deposition mask having regularly arranged apertures, the method including the steps of arranging the deposition mask and the substrate in such a way that the long sides of the apertures and pixels are parallel to the lengthwise direction of the evaporation sources irrespective of the direction in which the display panel regions are arranged within the substrate; and moving the substrate and the deposition mask relative to the evaporation sources, thereby forming the deposited patterns conforming to the pixels on the substrate.

2 Claims, 8 Drawing Sheets

Related Art

FIG. 9

Related Art

METHOD FOR PRODUCING DISPLAY DEVICE

CROSS REFERENCES TO RELATED APPLICATIONS

The present invention contains subject matter related to Japanese Patent Application JP 2008-005419 filed in the Japan Patent Office on Jan. 15, 2008, the entire contents of which being incorporated herein by reference.

BACKGROUND OF THE INVENTION

1. Field of the Invention

The present invention relates to a method for producing display devices, which includes a step of forming a patterned film by vapor deposition through a mask corresponding to a plurality of pixels arranged in an array of columns and rows.

2. Description of the Related Art

The display device having organic electroluminescence elements arranged and formed therein is usually produced by vapor deposition, which permits organic light-emitting materials corresponding to RGB colors to be deposited on a substrate through a metal mask having a plurality of apertures corresponding to pixels.

Figure 9:
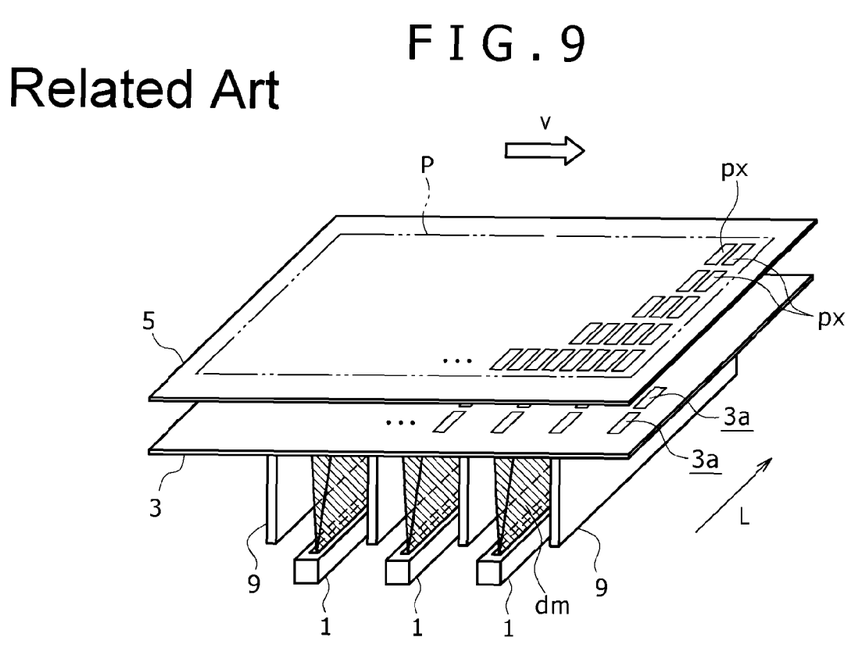
FIG. 9 is a perspective view illustrating an existing production method.
Figure 10:
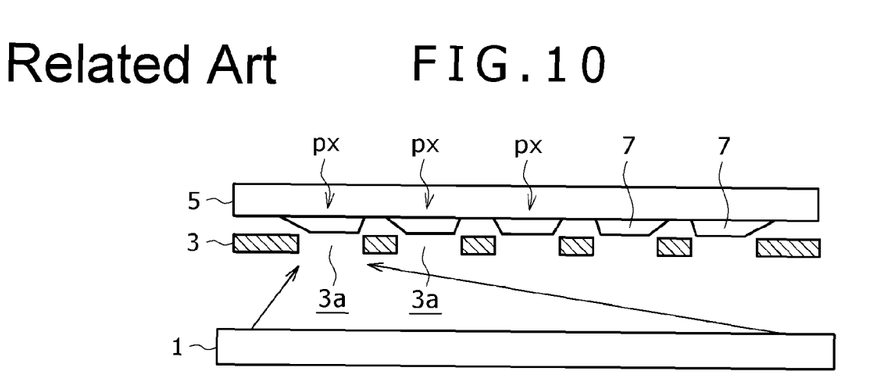
FIG. 10 is a side view illustrating an existing production method.

An example of mask vapor deposition is shown in FIG. 9 (perspective view) and FIG. 10 (side view). The illustrated mask deposition is intended to form a uniform film on a large substrate. It employs linear evaporation sources 1, each having a straight vapor outlet. Above the linear evaporation sources 1 is placed a vapor deposition mask 3, on which is closely placed a substrate 5. The mask 3 and the substrate 5 are moved relative to the linear evaporation sources 1 in the direction v perpendicular to the lengthwise direction L of the linear evaporation sources 1. During their movement, the deposition material dm evaporates from the linear evaporation sources 1 and passes through the apertures 3a in the mask 3 and deposits at each pixel px on the substrate 5. Thus there is obtained a patterned layer of electroluminescence 7.

Figure 11:
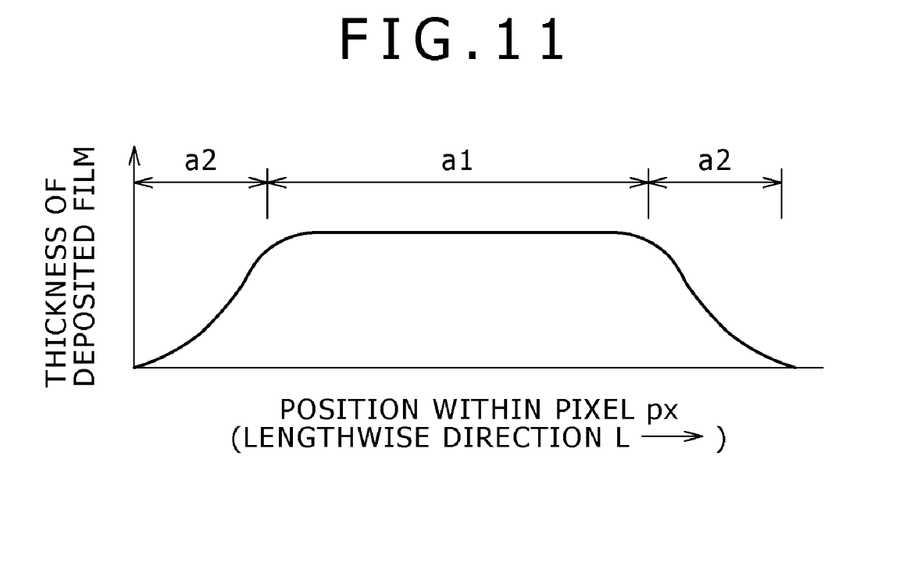
FIG. 11 is a diagram illustrating how deposition varies in thickness across each pixel in the direction parallel to the lengthwise direction (direction L) of the linear evaporation source.

The foregoing method usually needs a baffle 9 between the adjacent linear evaporation sources 1. This baffle 9 limits the angle of evaporation and prevents the mixing of the deposition materials evaporating from adjacent linear evaporation sources 1. Each evaporation source 1 is held between two baffles 9, so that there are two baffles 9 between adjacent evaporation sources 2. Incidentally, the deposition material dm evaporating from the linear evaporation source 1 does not deposit uniformly on the substrate. In other words, deposition varies in the lengthwise direction L of the linear evaporation source 1 on account of variation in the angle of evaporation with respect to the substrate 5, as shown in FIG. 10. As the result, the thickness of the deposited film varies across the pixel px on the substrate 5. The deposited film in the effective region a1 in the pixel (in the lengthwise direction L) is thick enough to work satisfactorily, but the deposited film gradually decreases in thickness on moving toward the edges, so that the deposited film in the marginal region a2 in the pixel does not work satisfactorily, as shown in FIG. 11.

Figure 12A:
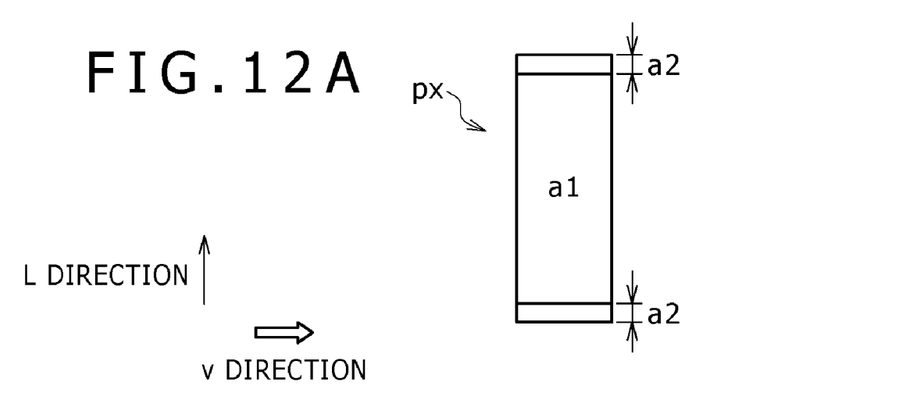
FIGS. 12A and 12B are diagrams illustrating the distribution of the marginal regions in each pixel.
Figure 12B:
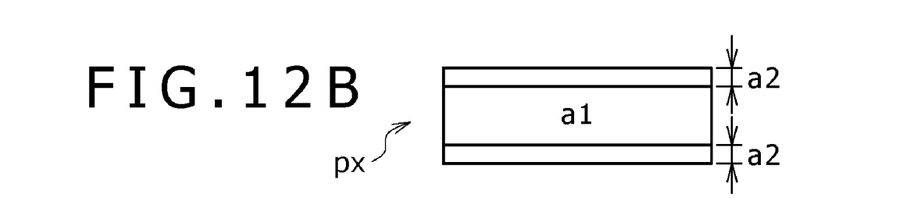

The vapor deposition may be accomplished by arranging the rectangular pixels such that their long sides are parallel to the lengthwise direction L of the linear evaporation source 1, as shown in FIG. 9. The deposited film formed in this manner has the wide marginal regions a2 at both edges along the short side of the pixel px, as shown in FIG. 12A. The area of the marginal region a2 in the pixel px is relatively small. Alternatively, the vapor deposition may also be accomplished by arranging the rectangular pixels such that their short sides are parallel to the lengthwise direction L of the linear evaporation source 1. In this case, as shown in FIG. 12B, the deposited film has the marginal regions a2 at both edges along the long sides of the pixel px. The area of the marginal region a2 in the pixel px is larger than that shown in FIG. 12A. See Japanese Patent Laid-Open No. 2003-17256.

SUMMARY OF THE INVENTION

Figure 13:
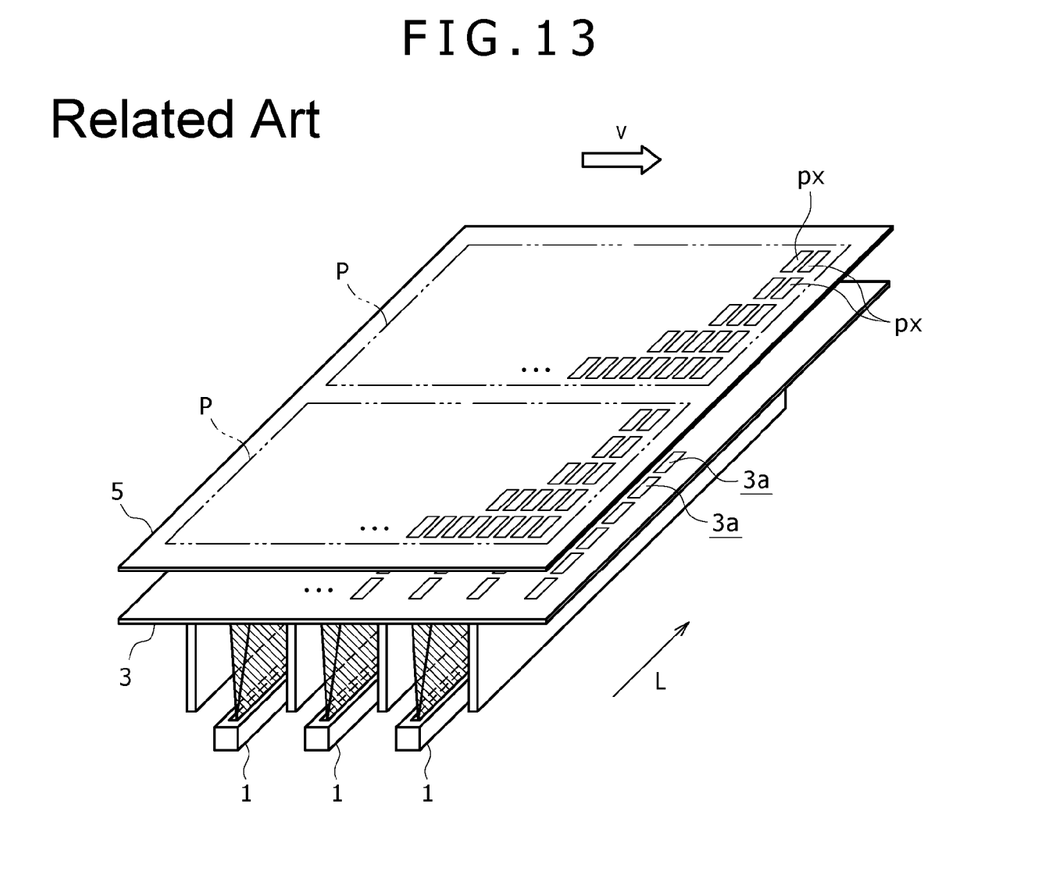
FIG. 13 is a perspective view illustrating problems encountered in the existing technology.

Existing display devices are usually constructed such that the long sides of the pixels px are parallel to the short sides of the display panel region P, as shown in FIG. 9. In the case where the rectangular substrate 5 is divided into two rectangular display panel regions P, the pixels px are arranged such that their long sides are parallel to the long sides of the substrate 5 or the short sides of the display panel region P, as shown in FIG. 13. If vapor deposition is to be carried out such that the marginal region a2 is small in the pixel px, as explained above with reference to FIG. 12A, it is necessary that the long sides of the substrate 5 should be parallel to the lengthwise direction of the linear evaporation source 1. Vapor deposition in this manner desires that the substrate 5 and the deposition mask 3 (shown in FIG. 9) should be turned through 90° relative to the linear evaporation source 1 and they should be moved in the direction v.

However, the foregoing operation needs additional large-scale equipment to rotate the substrate 5 and the deposition mask 3 through 90° in front and behind the vacuum chamber. Such additional equipment further needs means for moving the substrate 5 and the deposition mask 3 in directions parallel to their long and short sides. This results in complex facilities and increased costs.

In the case where the vapor deposition apparatus is so designed as to move the substrate 5 and the deposition mask 3 in the direction parallel to their short sides, moving them in the direction parallel to their long sides wastes the deposition material. By contrast, in the case where the vapor deposition apparatus is so designed as to move the substrate 5 and the deposition mask 3 in the direction parallel to their long sides, moving them in the direction parallel to their short sides causes variation in the thickness of deposited film on the substrate. This lowers yields.

It may be possible to install two vapor deposition units designed for the substrate 5 and the deposition mask 3 to move separately in different directions. However, this is inefficient and unrealistic because the number of substrates to be supplied to the vapor deposition units depends on upstream steps.

Embodiments of the present invention were completed to address the foregoing problems. It is an aim of the embodiments of the present invention to provide a method for producing high-performance display devices economically without expanding the existing apparatus with additional equipment. The method permits reasonable arrangement of display panels on a substrate and also permits vapor deposition for sufficient film thickness over the broad effective pixel region.

The embodiments of the present invention to achieve the foregoing aim are directed to a method for producing display devices by means of elongated evaporation sources and a deposition mask having regularly arranged apertures, the method including the steps of arranging a deposition mask and a substrate in such a way that the long sides of the apertures and pixels are parallel to the lengthwise direction of the evaporation sources irrespective of the direction in which the display panel regions are arranged within the substrate, and moving the substrate and the deposition mask relative to the evaporation sources, thereby forming deposited patterns conforming to pixels on the substrate.

The foregoing method for producing display devices permits vapor deposition to be carried out in such a way that the long sides of the pixels are parallel to the lengthwise direction of the evaporation sources irrespective of the direction in which the display panel regions are arranged within the substrate. In other words, in the case where the flat rectangular substrate and the deposition mask are moved relative to the elongated evaporation sources in the direction perpendicular to the lengthwise direction of the evaporation sources so as to form a deposition pattern on the substrate, the foregoing method yields a deposition pattern conforming to rectangular pixels whose long sides are parallel to the lengthwise direction of the evaporation sources in the display panel regions which may be arranged in any direction within the substrate. Thus, the foregoing method can be applied to any substrate without additional equipment so long as the substrate has the same length in the direction parallel to the lengthwise direction of the evaporation source. Vapor deposition by the foregoing method supplies pixels arranged in each display panel region with sufficiently thick, uniform deposit film.

The embodiments of the present invention permit pixels arranged in each display panel region to be covered with sufficiently thick deposit film over the broad effective pixel region while allowing the display panel regions to be arranged reasonably within the substrate without the necessity of modifying the existing deposition apparatus with additional equipment. Thus, it permits one to produce economically display devices excellent in display characteristics.

BRIEF DESCRIPTION OF THE DRAWINGS

FIGS. 5A and 5B are diagrams showing the digital camera to which the embodiments of the present invention are applied.

FIGS. 8A to 8G are diagrams showing a portable terminal, such as mobile phone.

DETAILED DESCRIPTION OF THE PREFERRED EMBODIMENTS

The embodiments of the present invention will be described with reference to the accompanying drawings. It is concerned with the production of an organic EL (electroluminescence) display device in which individual RGB pixels have respective organic EL elements. In this embodiment, the method according to the present invention is used to form the organic EL layer by vapor deposition. Incidentally, constituents identical with those in the existing technology are given the same symbols for explanation.

Figure 1:
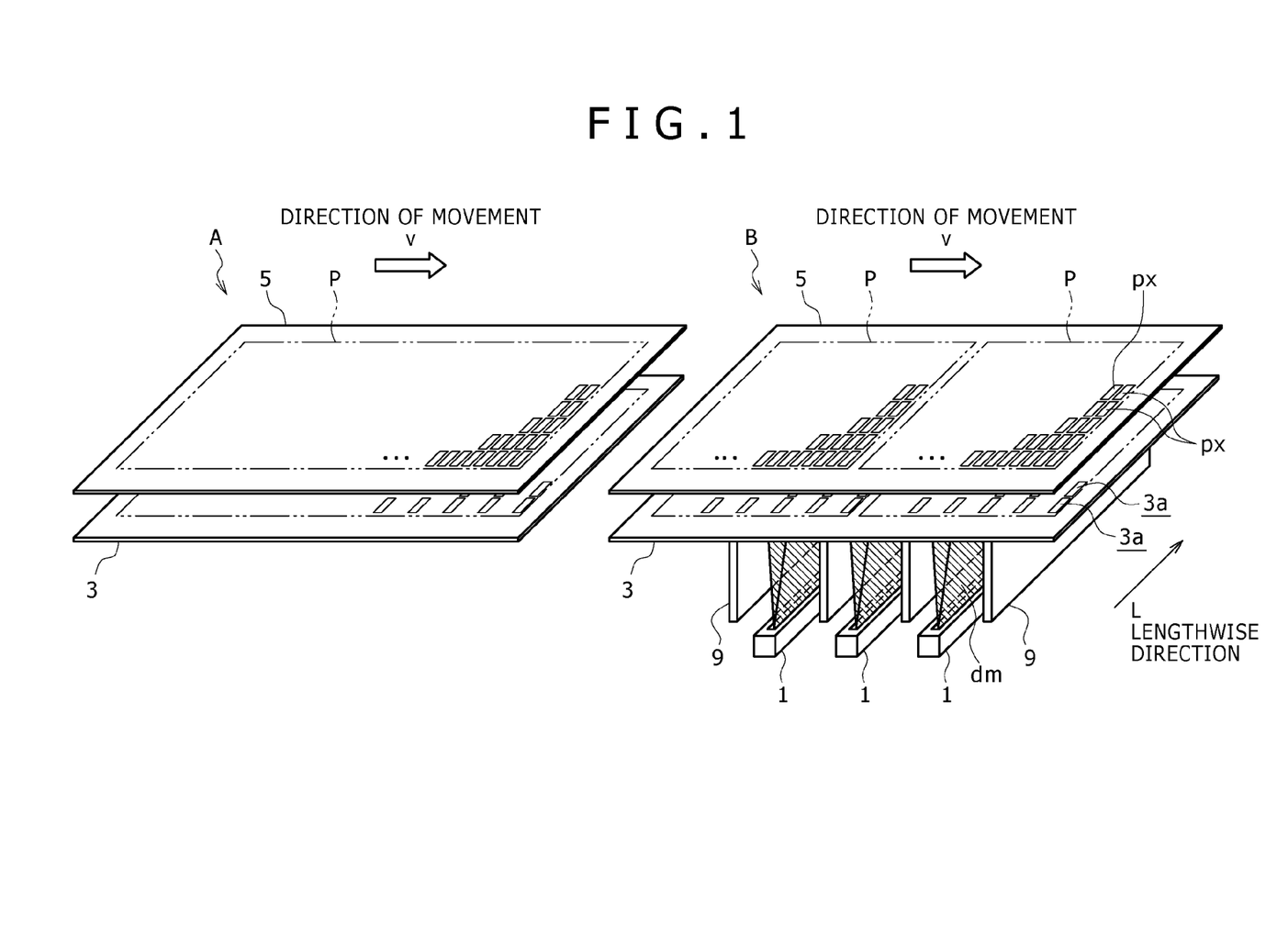
FIG. 1 is a perspective view illustrating the embodiments of the present invention.

The display device is produced by using the vapor deposition apparatus having a plurality of elongated evaporation sources 1 arranged in parallel to one another, as shown in FIG. 1. Each evaporation source 1 has a length conforming to the size of the substrate 5 to be treated for vapor deposition. For example, the length may correspond to the short side (or long side) of the rectangular substrate 5. In other words, the length of the evaporation source 1 practically determines the size of the substrate 5 (in terms of the length of the side in one direction).

Each evaporation source 1 has a vapor outlet which extends straight in its lengthwise direction, so that the deposition material dm evaporates uniformly along its length. The evaporation sources 1 individually evaporate the deposition material dm which is an organic hole injection material, an organic hole transfer material, and an organic light emitting material. Adjacent evaporation sources 1 are separated by the baffle 9 which prevents the mixing of the deposition materials dm evaporating from evaporation sources 1.

The evaporation apparatus has a means to support the deposition mask 3 and the substrate 5 (in close contact with each other) above the evaporation sources 1 and to move them together in the direction v perpendicular to the lengthwise direction of the evaporation sources 1. The evaporation sources may be stationary and the set of the deposition mask 3 and the substrate 5 may be movable, and vice versa.

The deposition mask 3 is a so-called metal mask. It closely resembles the substrate 5 in shape and has the apertures 3a corresponding to the pixels px arranged in the display panel region P within the substrate 5. Three deposition masks 3 are used; each having the apertures 3a at positions corresponding to the red (R) pixels, green (G) pixels and blue (B) pixels, respectively. The apertures 3a may open all together for the same adjacent colors.

The substrate 5 is a large rectangular one within which display panels are arranged. It is placed in the vapor deposition apparatus in such a way that its one side matches with the length of the evaporation source 1. In this embodiment, it is assumed that the short side of the substrate 5 equals the length of the evaporation source 1. The substrate 5 is arranged such that its short side is parallel to the lengthwise direction L of the evaporation source 1, and it is moved above the evaporation source 1 in the direction v perpendicular to the lengthwise direction L of the evaporation source 1. In other words, the substrate 1 is moved in the direction parallel to its long side. The substrate 5 having the long side as long as the evaporation source 1 should be moved in the direction parallel to its short side.

The substrate 5 has one or more display panel region P within it. The illustrated one has two. Thus, the substrate 5 is divided into rectangular display panel regions which are oriented with minimal waste.

In the case of layout A shown in FIG. 1, the substrate 5 has one display panel region P, which is nearly as large as the substrate 5. In the case of layout B shown in FIG. 1, the substrate 5 (which is identical with the foregoing one) has two display panel regions P which are arranged side by side in the direction of the long side. In the latter case, the long side of the display panel region P is parallel to the short side of the substrate 5, and vice versa. The length of the short side of the display panel region P is about half the length of the long side of the substrate 5.

In addition, the substrate 5 may have a plurality of rectangular display panel regions P varying in aspect ratio or direction of orientation (although not shown). It is important that the rectangular display panel regions P should be arranged with minimal waste within the substrate 5 to be treated in the vapor deposition apparatus.

In each display panel region P are arranged pixels px, each representing R, G, and B colors as a set. Each set of pixels representing three colors takes on a square shape, and each pixel takes on a rectangular shape that appears when a square is equally divided into three parts. According to the embodiments of the present invention, such rectangular pixels px are arranged in such a way that their long side is parallel to the lengthwise direction L of the evaporation source 1 irrespective of the direction in which the display panel regions P are arranged within the substrate 5.

Consequently, layout A and layout B (both shown in FIG. 1) differ from each other in that the long side of each pixel px orients in the direction which is either parallel to or perpendicular to the direction of the long side of each display panel region P arranged within the substrate 5.

In the illustrated case, the substrate 5 moves above the evaporation source 1 in the direction v which is parallel to the long side of the substrate 5. In this case, the lengthwise direction L of the evaporation source 1 is parallel to the short side of the substrate 5. Thus, the pixels px are arranged such that the long side of each pixel px is parallel to the short side of the substrate 5 which is parallel to the lengthwise direction L of the evaporation source 1.

Thus, in the case of layout A, in which merely one display panel region P (approximately as large as the substrate 5) is arranged within the substrate, the long side of the pixel px is parallel to the short side of the substrate 5 and is also parallel to the short side of the display panel region P. On the other hand, in the case of layout B, in which two display panel regions P are arranged within the substrate 5 (identical with the one used for layout A) in its lengthwise direction, the long side of the pixel px is parallel to the short side of the substrate 5 and is also parallel to the long side of the display panel region P.

The display panel region P is provided with circuits for the active matrix driving of organic EL elements formed in each pixel px and also with pixel electrodes connected to the driving circuits. The deposition mask 3 closely attached to the substrate 5, on which the display panel regions P having the pixels px are arranged, has the apertures 3a which coincide with the pixels px on the substrate 5. In other words, the rectangular apertures 3a are arranged in such a way that their long sides are parallel to the lengthwise direction of the evaporation source 1.

The substrate 5 and the deposition mask 3, which are in close contact with each other such that the deposition surface of the former faces the latter, are placed above the evaporation sources 1 in such a way that their short side is parallel to the lengthwise direction L of the evaporation sources 1, and then they are moved in the direction v perpendicular to the lengthwise direction L of the evaporation sources 1. During movement, the evaporation sources 1 evaporate the deposition materials dm. The deposition materials dm from the evaporation sources 1 at the upstream, midstream, and downstream positions pass through the apertures 3a and deposit on the pixels px sequentially. Deposition in this way gives rise to the organic EL layer of laminate structure.

The foregoing method applied to layout A and layout B works well to form rectangular pixels px which are arranged in the display panel region in such a way that their long side is parallel to the lengthwise direction L of the evaporation source 1 irrespective of the direction in which the rectangular display panels P are arranged within the substrate 5. With the foregoing method, it is possible to form the deposit film having a broad effective region a1 with a necessary thickness in each pixel (as explained above with reference to FIG. 12A), without additional equipment on the existing apparatus, regardless of substrates 5 so long as they are identical in the length of the side parallel to the lengthwise direction of the evaporation source 1.

As mentioned above, the embodiments of the present invention permit pixels arranged in each display panel region to be covered with sufficiently thick deposit film over the broad effective pixel region while allowing the display panel regions to be arranged reasonably within the substrate without the necessity of modifying the existing deposition apparatus with additional equipment. Thus, it permits one to produce economically display devices excellent in display characteristics.

<Circuits for Display Device>

Figure 2:
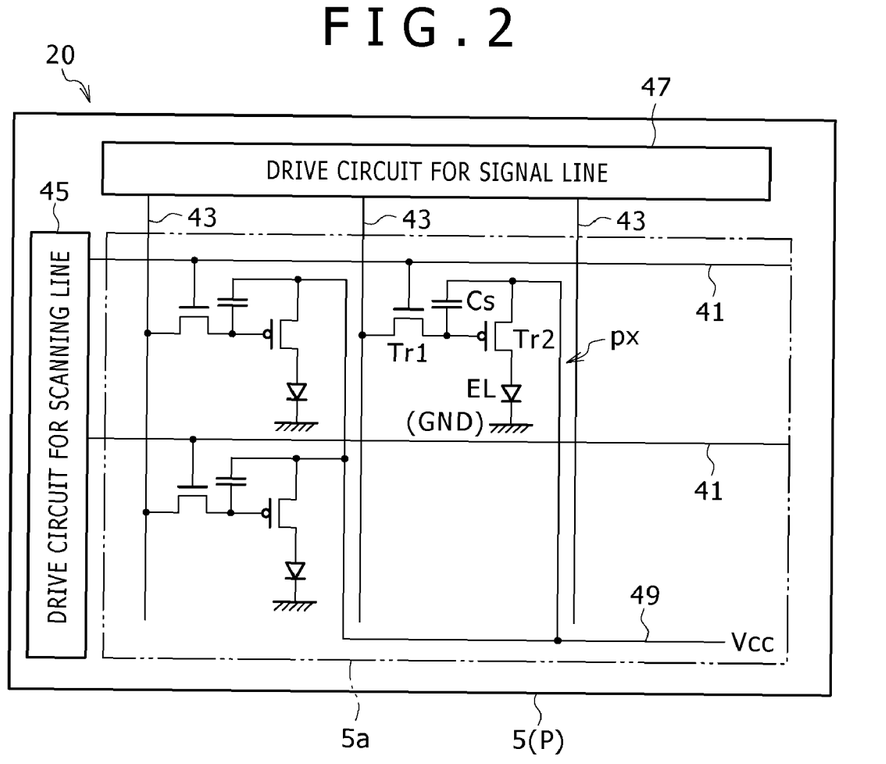
FIG. 2 is a circuit diagram of the display device according to the embodiments of the present invention.

FIG. 2 is a schematic circuit diagram for the display device to be produced by the above-mentioned method. The display device 20 is formed on the rectangular display panel region P as a divided portion of the substrate 5. The substrate 5 has thereon the display region 5a and its peripheral region. The display region 5a has the scanning lines 41 and the signal lines 43 in the horizontal and vertical directions, respectively. Individual pixels are at the intersections of the scanning and signal lines, and they constitute an array of pixels px.

Each pixel px is rectangular, and the direction of its orientation in the display panel region P is determined by the manufacturing method mentioned above. The periphery of the display region 5a having pixels px arranged therein contains the circuit 45 to drive the scanning lines 41 and the circuit 47 to supply the signal lines 43 with video signals (input signals) corresponding to brightness information.

Each pixel px at the intersection of the scanning line 41 and the signal line 43 has the pixel circuit which is composed of a thin-film transistor Tr1 for switching, a thin-film transistor Tr2 for driving, and a storage capacitor Cs. The pixel circuit is covered with an insulating film, on which an organic EL element connected to the pixel circuit is so formed as to cover the pixel px almost entirely. Each organic EL element including a pixel electrode connected to the pixel circuit, a common electrode for individual pixels px, and an organic light-emitting layer held between the two electrodes. The organic light-emitting layer is formed by vapor deposition through the mask mentioned above.

The display device 20 having the foregoing circuit works in the following manner. The scanning drive circuit 45 turns on the switching thin-film transistor Tr1, so that the video signal supplied from the signal line 43 is held by the storage capacitor Cs. The storage capacitor Cs in turn causes the driving thin-film transistor Tr2 to supply a current corresponding to the amount of signal held therein to the organic EL element, which in turn emits light corresponding to the magnitude of the current. Incidentally, the driving thin-film transistor Tr2 and the storage capacitor Cs are connected to the common source line (Vcc) 49.

Meanwhile, the pixel circuit mentioned above is merely one example, and it may be modified with optional capacitance elements or transistors and such modification may be supplemented with additional driving circuits.

Figure 3:
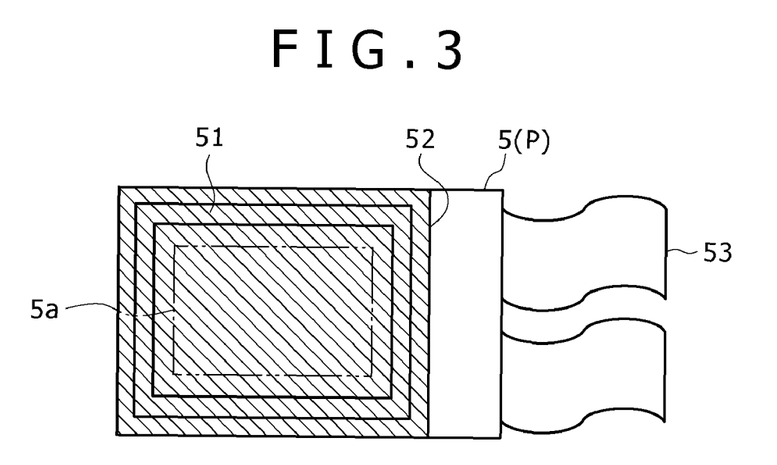
FIG. 3 is a diagram showing the sealed display device in module structure to which the embodiments of the present invention are applied.

The display device according to the embodiments of the present invention also includes that of sealed module type as shown in FIG. 3. The sealed module includes the display region 5a (containing the array of pixels) and the transparent substrate 52 of glass or the like, which are bonded together by the sealing part 51 (functioning as an adhesive). The substrate 52 may be provided with a color filter, protective film, light-shielding film, etc. The substrate 5 (or the display panel region P) on which the display region 5a is formed may be provided with a flexible printed circuit board 53 for introduction of signals into and from the display region 5a (containing the array of pixels).

<Examples of Application>

The display device produced by the above-mentioned method according to the embodiment of the present invention may be applied to various electronic instruments shown in FIGS. 4 to 8, which include television set, digital camera, notebook computer, video camera, and mobile phone. In these electronic instruments, it functions to display image signals entered from outside or generated inside. Some examples of such electronic instruments are explained in the following.

Figure 4:
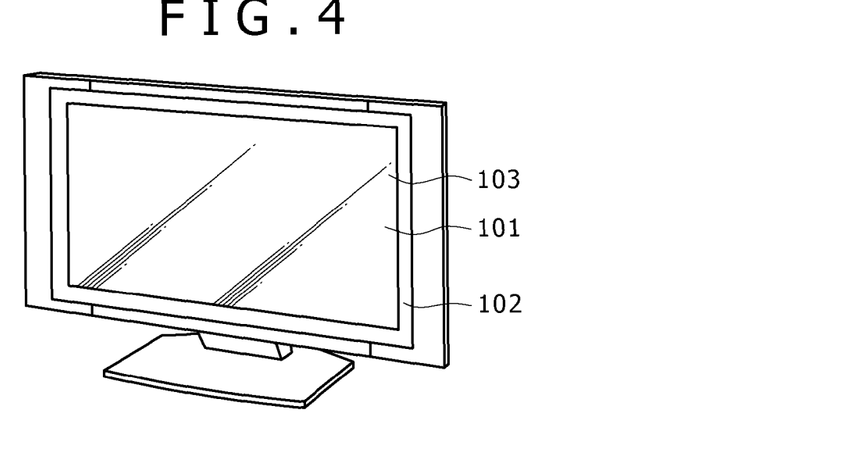
FIG. 4 is a perspective view of the television set to which the embodiments of the present invention are applied.

FIG. 4 is a perspective view of a television set to which the embodiments of the present invention are applied. The television set contains the image display screen 101 including the front panel 102 and the filter glass 103. The image display screen 101 is the display device pertaining to the embodiments of the present invention.

Figure 5A:
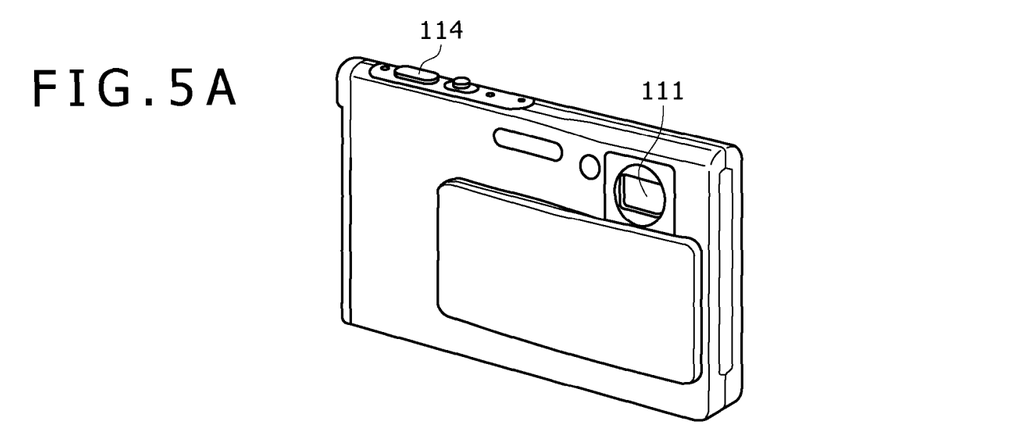
FIG. 5A is a perspective view from the front.
Figure 5B:
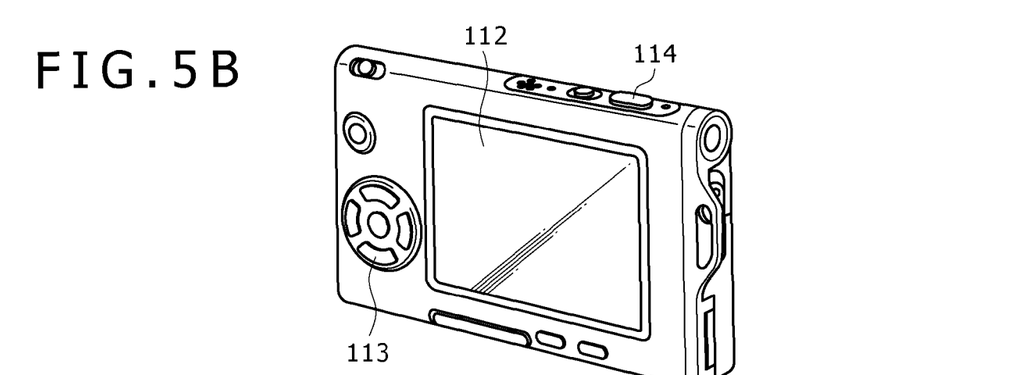
FIG. 5B is a perspective view from the rear.

FIGS. 5A and 5B are diagrams showing the digital camera to which the embodiments of the present invention are applied, FIG. 5A is a perspective view from the front, and FIG. 5B is a perspective view from the rear. The digital camera contains a flash 111, a display screen 112, a menu switch 113, and a shutter button 114. The display screen 112 is the display device pertaining to the embodiments of the present invention.

Figure 6:
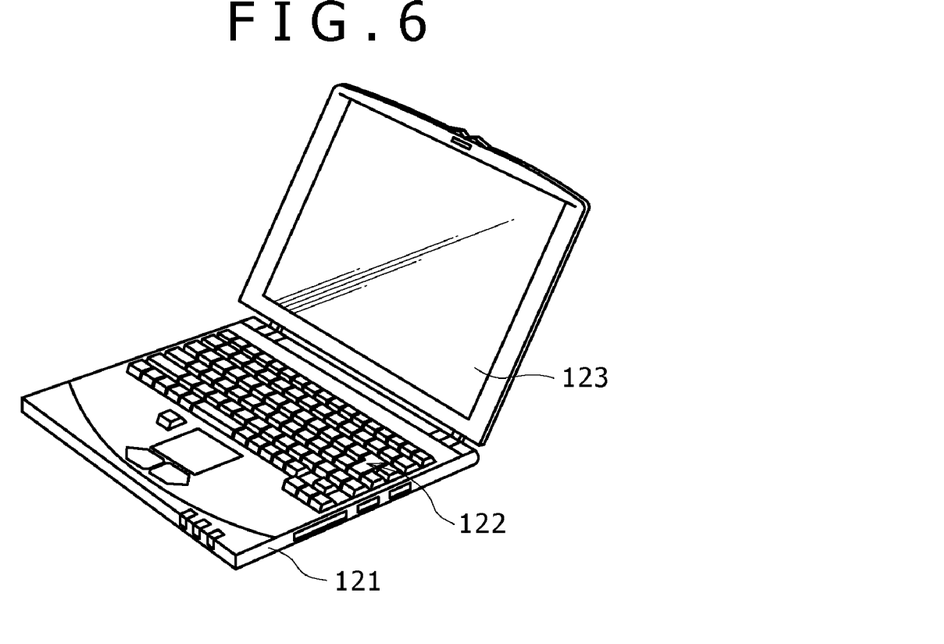
FIG. 6 is a perspective view showing the notebook personal computer to which the embodiments of the present invention are applied.

FIG. 6 is a perspective view of a notebook computer to which the embodiments of the present invention are applied. The notebook computer contains the main body 121, the keyboard 122 for entry of characters etc., and the display screen 123 to display images. The display screen 123 is the display device pertaining to the embodiments of the present invention.

Figure 7:
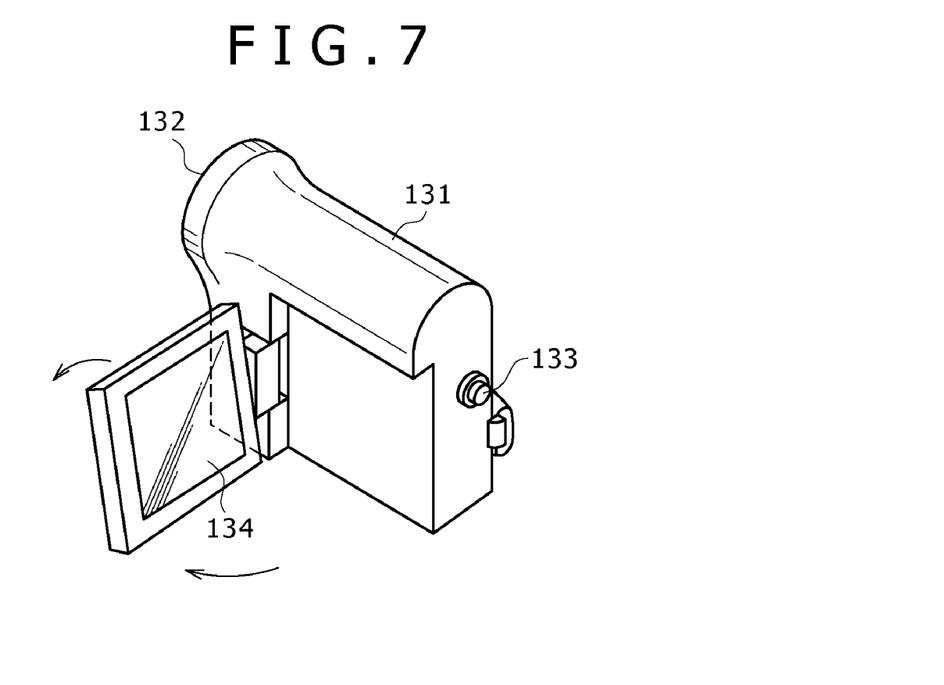
FIG. 7 is a perspective view showing the video camera to which the present embodiments of the invention are applied.

FIG. 7 is a perspective view of a video camera to which the embodiments of the present invention are applied. The video camera contains the main body 131, the objective lens 132, the start/stop switch 133, and the display screen 134. The display screen 134 is the display device pertaining to the embodiments of the present invention.

Figure 8A:
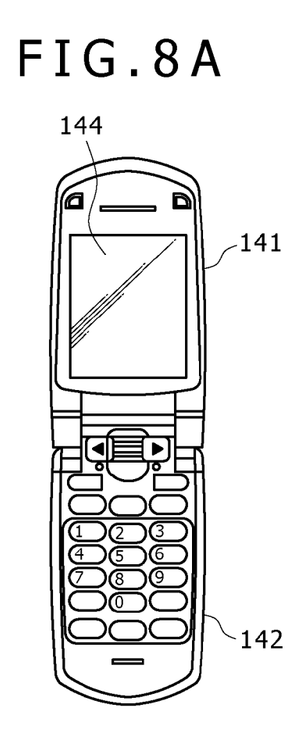
FIG. 8A is a front view in open state.
Figure 8B:
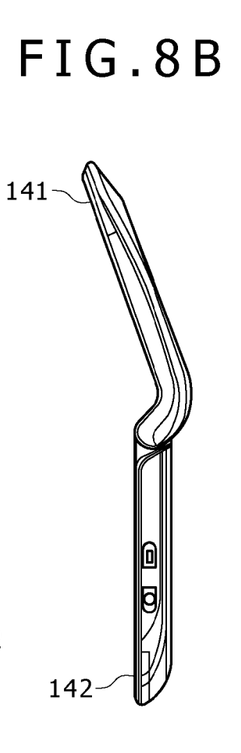
FIG. 8B is a side view.
Figure 8C:
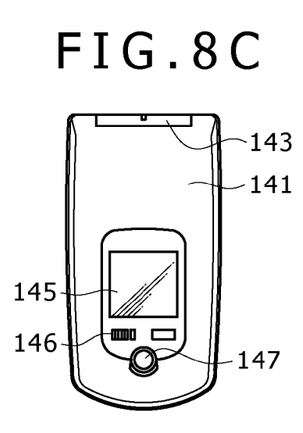
FIG. 8C is a front view in closed state.
Figure 8D:
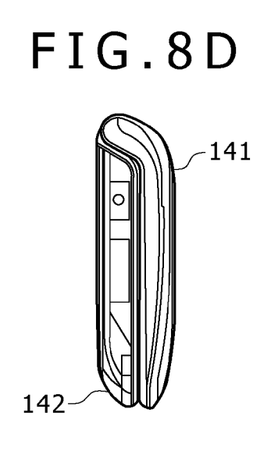
FIG. 8D is a left side view.
Figure 8E:
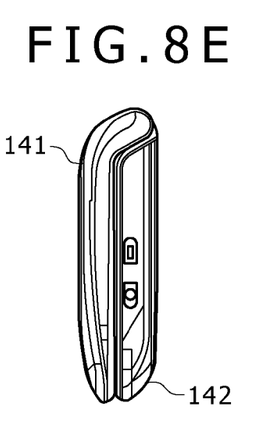
FIG. 8E is a right side view.
Figure 8F:
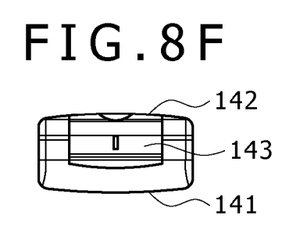
FIG. 8F is a top view.
Figure 8G:
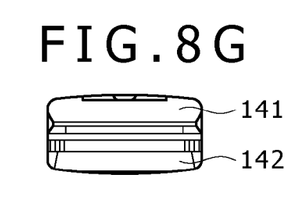
FIG. 8G is a bottom view.

FIGS. 8A to 8G are diagrams showing a portable terminal, such as mobile phone. FIG. 8A is a front view in open state. FIG. 8B is a side view. FIG. 8C is a front view in closed state. FIG. 8D is a left side view. FIG. 8E is a right side view. FIG. 8F is a top view. FIG. 8G is a bottom view. The mobile phone contains the upper casing 141, the lower casing 142, the connecting part (hinge) 143, the display 144, the subdisplay 145, the picture light 146, and the camera 147. The display 144 and the subdisplay 145 are the display device pertaining to the embodiments of the present invention.

It should be understood by those skilled in the art that various modifications, combinations, sub-combinations and alterations may occur depending on design requirements and other factor in so far as they are within the scope of the appended claims or the equivalents thereof.

What is claimed is:

1. A method for producing display devices for forming deposited patterns conforming to pixels on a substrate by means of elongated evaporation sources and a deposition mask having regularly arranged apertures, the pixels and apertures having respective long sides and short sides, said method comprising the steps of:

providing said substrate with parallel long sides and parallel short sides and on which are designated plural display panel regions, each display panel region used to produce a separate display panel, the display panel regions being rectangular in shape and having short sides parallel to the long sides of said substrate;

providing said deposition mask with parallel long sides and parallel short sides corresponding to those of said substrate, said deposition mask having said apertures for said pixels in relationship to each display panel region;

providing said evaporation sources such that lengths thereof match the lengths of said short sides of said substrate and said deposition mask;

arranging said deposition mask and said substrate in such a way that the long sides of said apertures and pixels and long sides of said display panel regions are parallel to the lengthwise direction of said evaporation sources; and moving said substrate and said deposition mask relative to said evaporation sources, thereby forming said deposited patterns conforming to said pixels on said substrate.

2. The method of claim 1, wherein said deposited pattern is a pattern of organic light-emitting layer.

* * * * *